United States Patent [19]
Morisako

[11] Patent Number: 6,033,586
[45] Date of Patent: Mar. 7, 2000

[54] APPARATUS AND METHOD FOR SURFACE TREATMENT

[75] Inventor: Isamu Morisako, Fukuoka, Japan

[73] Assignee: Matsushita Electric Industrial Co., Ltd., Osaka, Japan

[21] Appl. No.: 08/890,828

[22] Filed: Jul. 10, 1997

[30] Foreign Application Priority Data

Sep. 18, 1996 [JP] Japan .................................. 8-245846

[51] Int. Cl.⁷ ...................................................... H05H 1/00
[52] U.S. Cl. ........................ 216/71; 156/345; 118/723 E
[58] Field of Search ................... 156/345; 118/723 E; 438/729; 216/71

[56] References Cited

U.S. PATENT DOCUMENTS

| | | | |
|---|---|---|---|
| 4,616,597 | 10/1986 | Kaganowicz | 118/723 E |
| 4,618,477 | 10/1986 | Babu et al. | 156/345 |
| 4,724,296 | 2/1988 | Morley | 156/345 |
| 5,057,185 | 10/1991 | Thomas, III et al. | 156/345 |
| 5,314,603 | 5/1994 | Sugiyama et al. | 156/345 |
| 5,462,898 | 10/1995 | Chen et al. | 438/788 |

FOREIGN PATENT DOCUMENTS 3159143   7/1991   Japan .

*Primary Examiner*—Thi Dang
*Attorney, Agent, or Firm*—Stevens, Davis, Miller & Mosher, L.L.P.

[57] ABSTRACT

Front and reverse surfaces of a workpiece are treated with plasma simultaneously while the workpiece is arranged between electrodes in such a manner that one of the electrode is opposite to the front surface, and another of the electrodes is opposite to the back surface, and a voltage supplied to each of the electrodes is changed frequently.

23 Claims, 4 Drawing Sheets

6,033,586

APPARATUS AND METHOD FOR SURFACE TREATMENT

BACKGROUND OF THE INVENTION AND RELATED ART STATEMENT

The present invention relates to an apparatus and method for treating a surface of a workpiece with plasma.

JP-A-3-159143 discloses a plasma cleaning apparatus in which one of the electrodes is energized by an alternating current, another of the electrodes is grounded, and a substrate to be treated or cleaned with plasma is arranged between the electrodes.

OBJECT AND SUMMARY OF THE INVENTION

An object of the present invention is to provide an apparatus and method for treating a surface with plasma, by which apparatus and method front and back surfaces of a workpiece are simultaneously treated effectively.

According to the present invention for treating front and reverse surfaces of a workpiece with plasma, the workpiece is arranged between electrodes in such a manner that one of the electrodes is opposite to the front surface, and another of the electrodes is opposite to the back surface, and a voltage supplied to each of the electrodes is changed frequently.

Since the voltage supplied to each of the electrodes is changed frequently, plasma oscillation is generated and accelerated between the front surface and the one of the electrodes and between the back surface and the another of the electrodes by the voltage change of each of the electrodes. Therefore, both of the front and reverse surfaces are treated simultaneously and effectively by the accelerated plasma oscillation over both of the front and reverse surfaces, and an evenness in treating degree between the front and back surfaces can be improved by evenly accelerating the plasma oscillation over the front and reverse surfaces in comparison with the prior art, or a difference in treating degree between the front and back surfaces can be controlled desirably by controlling the acceleration of the plasma oscillation over each of the front and reverse surfaces with adjusting a voltage changing degree of each of the electrodes.

When an electric potential difference is generated between the electrodes, the plasma is effectively generated. When a phase of a voltage change of the one of the electrodes is shifted relative to that of the another of the electrodes, the plasma is effectively generated. When an alternating current is supplied to each of the electrodes, the plasma oscillation over each of the front and back surfaces is effectively accelerated. When a phase of an alternating current supplied to the one of the electrodes is shifted relative to another phase of another alternating current supplied to the another of the electrodes (preferable) or when the phase of the alternating current supplied to the one of the electrodes is substantially inversed relative to that of the another alternating current supplied to the another of the electrodes (most preferable), the plasma is effectively generated and the plasma oscillation over each of the front and back surfaces is effectively accelerated.

Both of the front and back surfaces may be exposed to a plasma gas as the plasma. A material gas (for example, oxygen, argon or the like) may be supplied to a space (preferably vacuumed) between the electrodes to be converted to the plasma gas by an electric field between the electrodes. The electrodes may extend substantially symmetrically relative to the workpiece.

A voltage change degree of absolute value (amplitude) and/or frequency of the voltage change of the one of the electrodes may be different from that of the another of the electrodes so that the difference in treating degree between the front and back surfaces can be controlled desirably by controlling the acceleration of the plasma oscillation and/or the formation of the plasma over each of the front and reverse surfaces with adjusting the amplitude of each of the electrodes. The voltage change degree of absolute value (amplitude) and/or frequency of the voltage change of the one of the electrodes may be substantially equal to that of the another of the electrodes so that the evenness in treating degree between the front and back surfaces can be improved by evenly accelerating the plasma oscillation and/or forming the plasma over the front and reverse surfaces.

DETAILED DESCRIPTION OF PREFERRED EMBODIMENTS

Figure 1:
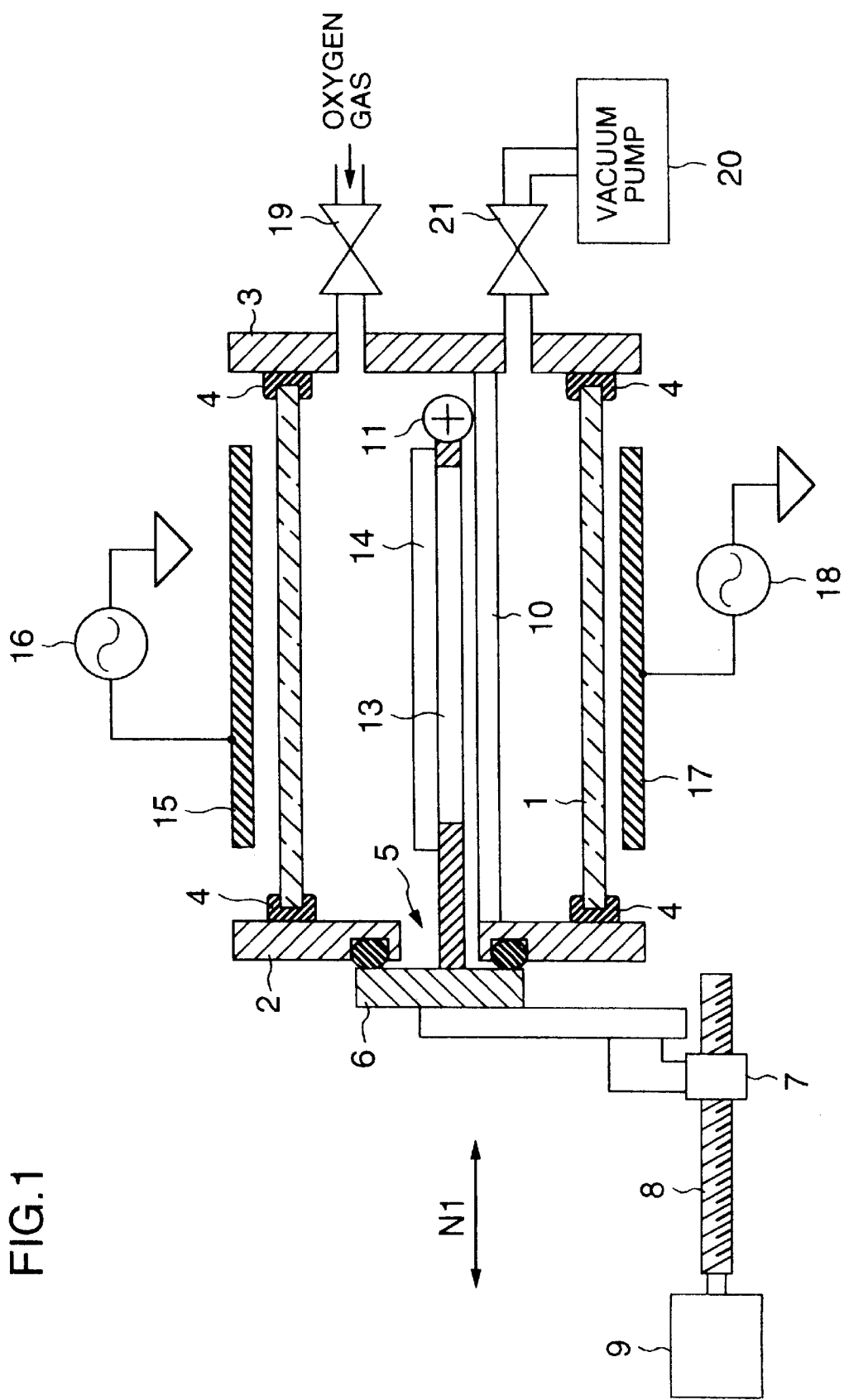
FIG. 1 is a schematic cross-sectional view of a first embodiment of the present invention, taken along an imaginary plane including a longitudinal axis of an apparatus.
Figure 2:
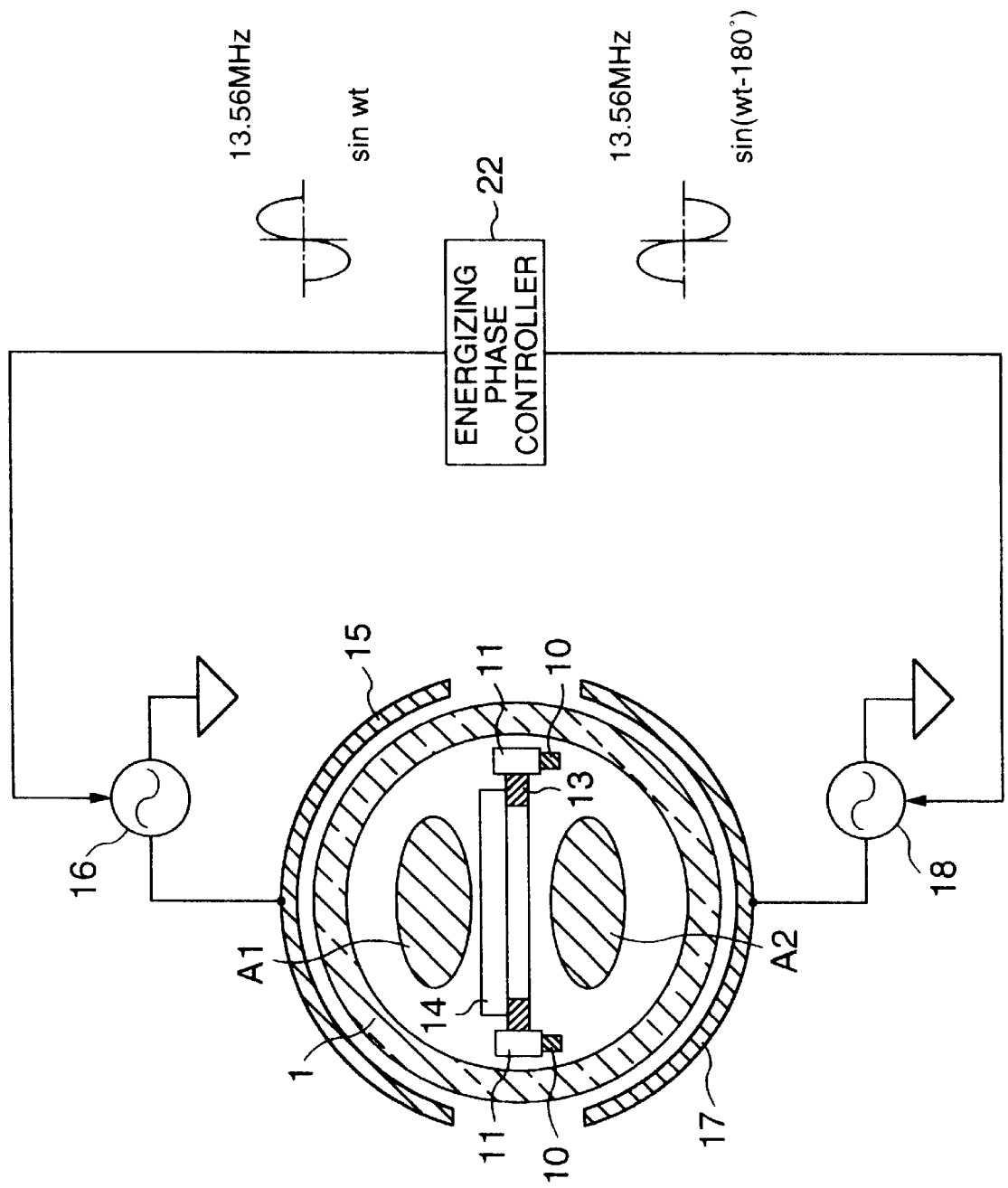
FIG. 2 is a schematic cross-sectional view of the first embodiment of the present invention, taken along an imaginary plane perpendicular to the longitudinal axis of the apparatus.

A first embodiment is shown in FIGS. 1 and 2. A container 1, preferably formed by a thick glass tube, receives a workpiece 14 (for example, epoxy substrate reinforced by glass fiber) therein, and an inside thereof is vacuumed preferably to 5~50 Pa through an exhaust valve 21 by a vacuum pump 20 and includes a slight amount (low pressure) of a gas comprising a plasma gas and a material gas (for example, oxygen, inert gas such as argon or the like) supplied from an inlet valve 19 to be converted to the plasma gas by an electrical field. End openings of the container 1 are hermetically sealed and closed by first and second end plates 2, 3 and O-rings 4. The first end plate 2 has a through hole 5 through which the workpiece 14 is taken into and out of the container 1. When the workpiece 14 is treated by the plasma gas or the material gas is supplied into the container 1 from the opened inlet valve 19 with a vacuum being applied through the opened exhaust valve 21 by the vacuum pump 20, the through hole 5 is closed by a door plate 6 driven in a direction N1 through an engaging combination of a feed screw 8 and a feed nut 7 by a motor 9. The door plate 6 is connected to a support frame 13 with the workpiece 14 thereon movably guided in the direction N1 through a rotatable roller 11 by a rail 10 fixed to the container 1, so that the workpiece 14 is taken into and out of the container 1 on the support frame 13.

Front and reverse surfaces of the workpiece 14 supported by the support frame 13 are exposed to the plasma gas in the container 1. First and second electrodes 15, 17 extend to surround the container 1 substantially symmetrically relative to the workpiece 14 between the first and second electrodes 15, 17 in such a manner that the front and reverse surfaces of the workpiece 14 are opposed to the first and second electrodes 15, 17 respectively.

The first electrode 15 is energized by a high-frequency (for example, 13.56 MHz or 13.56 MHz×N (N=2, 3, 4 . . . )) current-and/or-voltage source 16, and the second electrode 17 is energized by a high-frequency current-and/or-voltage source 18 (for example, 13.56 MHz or 13.56 MHz×N (N=2, 3, 4 . . . ), that is, the same frequency as the first electrode 15) so that plasma regions A1 and A2 are formed respectively between the first electrode 15 and the first surface of the workpiece 14 and between the second electrode 17 and the second surface of the workpiece 14. Generation of the plasma gas is accelerated by a high-frequency current-and/or-voltage change (for example, voltage change width is about 1 kV) of each of the first and second electrodes 15, 17, and acceleration of plasma oscillation of the plasma gas is performed by the high-frequency current-and/or-voltage change of each of the first and second electrodes 15, 17. A phase of the high-frequency current-and/or-voltage change of the first electrode 15 is shifted relative to that of the second electrode 17 to form the electrical field between the first and second electrodes 15, 17. A difference in phase of the high-frequency current-and/or-voltage change between the first and second electrodes 15, 17 is preferably 180 degrees, that is, the phase of the high-frequency current-and/or-voltage change of the first electrode 15 is preferably inversed relative to that of the second electrode 17 to obtain the maximum formation of the plasma and maximum acceleration of the plasma oscillation. The high-frequency current-and/or-voltage sources 16 and 18 may supply respective alternating currents inversed relative to each other to the first and second electrodes 15, 17.

Free radicals, electrically charged particles and so forth of the plasma regions A1 and A2 collide against the front and back surfaces of the workpiece 14 to treat them simultaneously. A treating time is usually 1~5 minutes.

Figure 3:
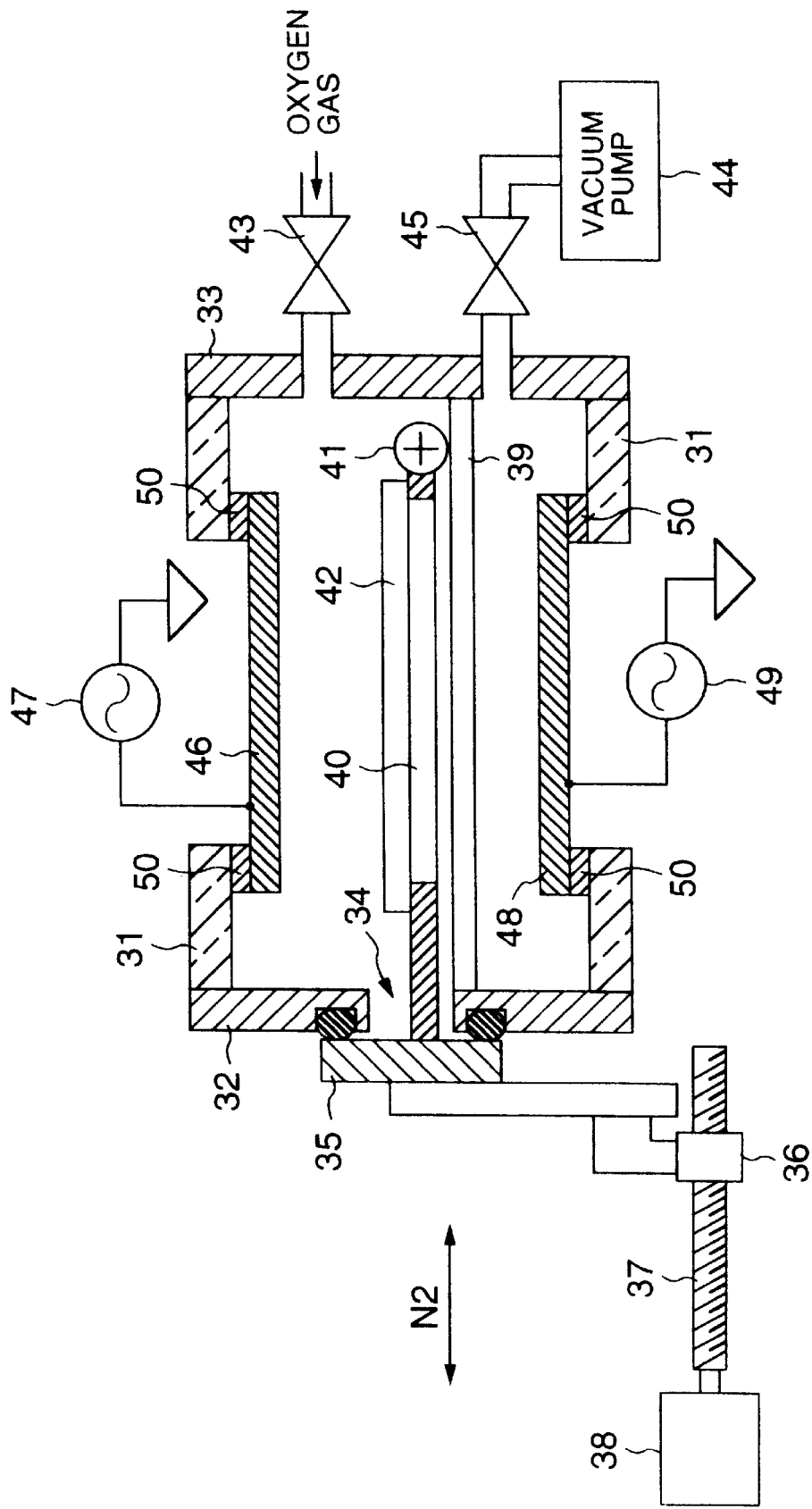
FIG. 3 is a schematic cross-sectional view of a second embodiment of the present invention, taken along an imaginary plane including a longitudinal axis of another apparatus.
Figure 4:
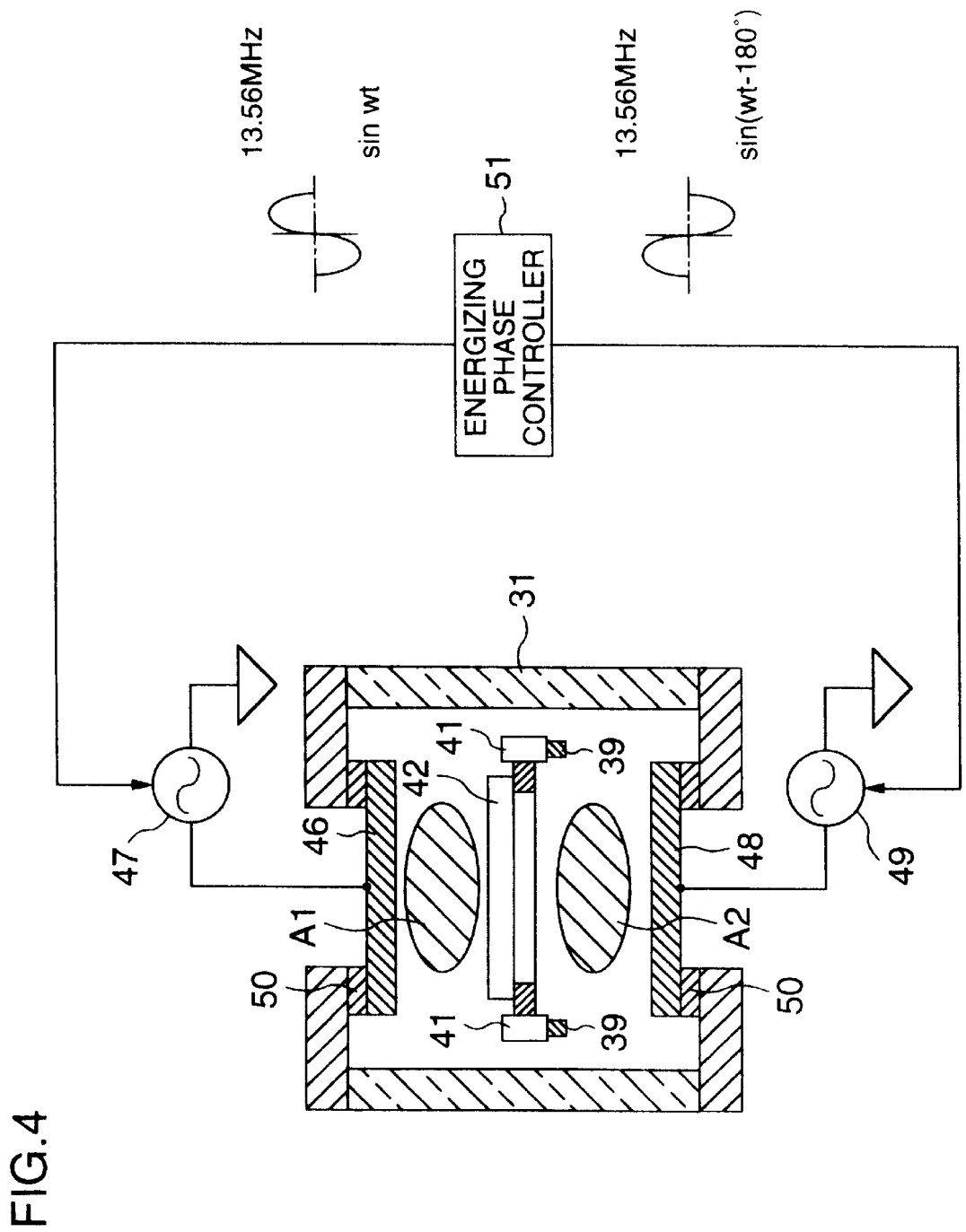
FIG. 4 is a schematic cross-sectional view of the second embodiment of the present invention, taken along an imaginary plane perpendicular to the longitudinal axis of the another apparatus.

A second embodiment is shown in FIGS. 3 and 4. A rectangular container 31 receives a workpiece 42 therein, and an inside thereof is vacuumed through an exhaust valve 45 by a vacuum pump 44 and includes a slight amount (low pressure) of a gas comprising a plasma gas and a material gas (for example, oxygen, argon or the like) supplied from an inlet valve 43 to be converted to the plasma gas by an electrical field. End openings of the container 31 are hermetically sealed and closed by first and second end plates 32, 33. The first end plate 32 has a through hole 34 through which the workpiece 42 is taken into and out of the container 31. When the workpiece 42 is treated by the plasma gas or the material gas is supplied into the container 31 from the opened inlet valve 43 with a vaccuum being applied through the opened exhaust valve 45 by the vacuum pump 44, the through hole 34 is closed by a door plate 35 driven in a direction N2 through an engaging combination of a feed screw 37 and a feed nut 36 by a motor 38. The door plate 35 is connected to a support frame 40 with the work-piece 42 thereon movably guided in the direction N2 through a rotatable roller 41 by a rail 39 fixed to the container 31, so that the workpiece 42 is taken into and out of the container 31 on the support frame 40.

Front and reverse surfaces of the workpiece 42 supported by the support frame 40 are exposed to the plasma gas in the container 31. First and second electrodes 46, 48 extending substantially parallel to each other are fixed to the container 31 through electrically insulating members 50 as parts of the container 31 substantially symmetrically relative to the workpiece 42 between the first and second electrodes 46, 48 in such a manner that the front and reverse surfaces of the workpiece 42 are opposed to the first and second electrodes 46, 48 respectively.

The first electrode 46 is energized by a high-frequency (for example, 13.56 MHz) current-and/or-voltage source 47, and the second electrode 48 is energized by a high-frequency current-and/or-voltage source 49 (for example, 13.56 MHz, that is, the same frequency as the first electrode 46) so that plasma regions A1 and A2 are formed respectively between the first electrode 46 and the first surface of the workpiece 42 and between the second electrode 48 and the second surface of the workpiece 42. Generation of the plasma gas is accelerated by a high-frequency current-and/or-voltage change of each of the first and second electrodes 46, 48, and acceleration of plasma oscillation of the plasma gas is performed by the high-frequency current-and/or-voltage change of each of the first and second electrodes 46, 48. A phase of the high-frequency current-and/or-voltage change of the first electrode 46 is shifted relative to that of the second electrode 48 to form the electrical field between the first and second electrodes 46, 48. A difference in phase of the high-frequency current-and/or-voltage change between the first and second electrodes 46, 48 is preferably 180 degrees, that is, the phase of the high-frequency current-and/or-voltage change of the first electrode 46 is preferably inversed relative to that of the second electrode 48 to obtain the maximum formation of the plasma and maximum acceleration of the plasma oscillation. The high-frequency current-and/or-voltage sources 47 and 49 may supply respective alternating currents inversed relative to each other to the first and second electrodes 46, 48.

The free radicals, electrically charged particles and so forth of the plasma regions A1 and A2 collide against the front and back surfaces of the workpiece 42 to treat them simultaneously.

What is claimed is:

1. A method for treating front and reverse surfaces of a workpiece with plasma, comprising the steps of:
    arranging the workpiece between electrodes in such a manner that one of the electrodes is opposite to the front surface to generate plasma between said one of the electrodes and said front surface, and another of the electrodes is opposite to the back surface to generate plasma between the another of the electrodes and the back surface, and
    changing frequently a voltage supplied to each of the electrodes, wherein a phase of an alternating current supplied to the one of the electrodes is substantially inverse relative to that of another alternating current supplied to the another of the electrodes.

2. A method according to claim 1, wherein an electric potential difference is generated between the electrodes.

3. A method according to claim 1, wherein a phase of a voltage change of the one of the electrodes is shifted relative to that of the another of the electrodes.

4. A method according to claim 1, wherein an alternating current is supplied to each of the electrodes.

5. A method according to claim 1, wherein a phase of an alternating current supplied to the one of the electrodes is shifted relative to another phase of another alternating current supplied to the another of the electrodes.

6. A method according to claim 1, wherein both of the front and back surfaces are exposed to a plasma gas.

7. A method according to claim 1, wherein a material gas is supplied to a space between the electrodes to be converted to a plasma gas by an electric field between the electrodes.

8. A method according to claim 1, wherein the electrodes extend substantially symmetrically relative to the workpiece.

9. A method according to claim 1, wherein a voltage change of the one of the electrodes is different from that of the another of the electrodes.

10. A method according to claim 1, wherein a voltage change of the one of the electrodes is substantially equal to that of the another of the electrodes.

11. An apparatus for treating front and reverse surfaces of a workpiece with plasma, said apparatus comprising, a container receiving the workpiece therein, electrodes between which the workpiece is arranged in such a manner that one of the electrode is opposite to the front surface, and another of the electrodes is opposite to the back surface, and a power source for supplying a frequently changing voltage to each of the electrodes, wherein a phase of an alternating current supplied to the one of the electrodes is substantially inverse relative to that of another alternating current supplied to the another of the electrodes.

12. An apparatus according to claim 11, wherein said voltage generates an electric potential difference between the electrodes.

13. An apparatus according to claim 11, wherein a phase of a voltage change of the one of said voltage applied to the electrodes is shifted relative to that of the another of the electrodes.

14. An apparatus according to claim 12, wherein said power source supplies an alternating current to each of the electrodes.

15. An apparatus according to claim 12, wherein said power source supplies a first alternating current to the one of the electrodes and a second alternating current to the another of the electrodes, said first alternating current having a phase that is shifted relative to a phase of said second alternating current.

16. An apparatus according to claim 11, wherein said voltage generates a plasma gas in the container and both the front surface and the back surface of said workpiece are exposed to said plasma gas in the container.

17. An apparatus according to claim 11, further comprising means for supplying a material gas to a space in the container between the electrodes to be converted to a plasma gas by said voltage which generates an electric field between the electrodes.

18. An apparatus according to claim 11, wherein the electrodes extend substantially symmetrically relative to the workpiece.

19. An apparatus according to claim 11, wherein said voltage supply means controls a voltage change of the one of the electrodes to be different from a voltage change of the another of the electrodes.

20. An apparatus according to claim 11, wherein said voltage supply means controls a voltage change of the one of the electrodes to be substantially equal to a voltage chance of the another of the electrodes.

21. An apparatus according to claim 11, further comprising a support member for supporting thereon the workpiece in such a manner that the front and reverse surfaces of the workpiece are exposed to the plasma.

22. An apparatus according to claim 21, wherein the support member is movable to cause the workpiece to be moved into and out of the container.

23. An apparatus according to claim 22, wherein the container has a through hole through which the workpiece is moved into and out of the container, and the support member has a door plate to close the through hole when the workpiece is inside the container and being treated by the plasma.

* * * * *